(12) United States Patent
Shouyama et al.

(10) Patent No.: US 8,169,788 B2
(45) Date of Patent: May 1, 2012

(54) PRINTED BOARD AND PRINTED-BOARD-RECEIVING STRUCTURE

(75) Inventors: Hiroyuki Shouyama, Fukuoka (JP); Yoshiyuki Nakayama, Fukuoka (JP); Yoshiaki Tobimatsu, Fukuoka (JP); Kazuya Fuke, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 188 days.

(21) Appl. No.: 12/611,422

(22) Filed: Nov. 3, 2009

(65) Prior Publication Data

US 2010/0124034 A1    May 20, 2010

(30) Foreign Application Priority Data

Nov. 18, 2008    (JP) ................................. 2008-294874

(51) Int. Cl.
*H05K 7/14* (2006.01)

(52) U.S. Cl. ........ 361/756; 361/741; 361/802; 361/796; 361/797

(58) Field of Classification Search .................. 361/741, 361/756, 788, 796, 797, 802
See application file for complete search history.

(56) References Cited

U.S. PATENT DOCUMENTS

| 5,067,233 | A  | * | 11/1991 | Solomon ....................... 438/107 |
| 6,272,013 | B2 | * | 8/2001  | Negishi ........................ 361/695 |
| 2008/0157455 | A1 | * | 7/2008 | Lester et al. .................. 269/287 |

FOREIGN PATENT DOCUMENTS

| JP | 6232533 | * | 8/1994 |
| JP | 07-14690 U | | 3/1995 |
| JP | 1168350 | * | 8/1997 |
| JP | 11-68350 A | | 3/1999 |

\* cited by examiner

*Primary Examiner* — Dameon Levi
(74) *Attorney, Agent, or Firm* — Fujitsu Patent Center

(57) ABSTRACT

A printed board to be loaded into a printed-board-receiving structure having a backboard and a guide rail, the backboard having a connector plug-in connectable to a connector on the printed board, the guide rail guiding the printed board toward the backboard and having a groove including a sloping portion, the printed board includes a sloping portion forming a projection at an end of the printed board, the projection being fittable and slidable along the groove in the guide rail.

10 Claims, 14 Drawing Sheets

PRINTED BOARD AND PRINTED-BOARD-RECEIVING STRUCTURE

CROSS-REFERENCES TO RELATED APPLICATIONS

This application is based upon and claims the benefit of priority of the prior Japanese Patent Application No. 2008-294874, filed on Nov. 18, 2008, the entire contents of which are incorporated herein by reference.

FIELD

The embodiments relate to a printed board loadable into a shelf unit and to a printed-board-receiving structure. The embodiments are applicable to, for example, a case where a plurality of different printed boards having different thicknesses are loaded into a shelf unit.

BACKGROUND

Many known apparatuses such as optical transmission apparatuses and communication apparatuses include shelf units. A shelf unit can receive a number (about 20) of plug-in units (PIUs) and interface boards (hereinafter referred to as "printed boards") having different functions. A printed-board-receiving structure employed in a known shelf unit will now be briefly described with reference to FIGS. 13 to 14B.

FIG. 13 is a perspective view illustrating the appearance of a known shelf unit. FIG. 14A is a perspective view of a printed board to be used with the known shelf unit. FIG. 14B is a longitudinal sectional view of relevant parts of the printed board illustrated in FIG. 14A.

Referring to FIG. 13, a casing body 2 of a known shelf unit 1 can receive therein a plurality of printed boards 3. The casing body 2 of the shelf unit 1 is made up of a top board 5, a bottom board 6, a left-side board 7, a right-side board 8, and a back wiring board (hereinafter referred to as a "backboard") 9 provided at the back of the casing body 2.

The backboard 9 of the shelf unit 1 is provided with connectors 10 fixed at particular positions thereof. The connectors 10 each engage with a connector 4 provided on a printed board 3 to be loaded into the shelf unit 1, thereby becoming electrically connected thereto.

Referring to FIG. 13, the bottom board 6 of the shelf unit 1 is provided with guide rails 11 each having a rectangular groove 12. The printed boards 3 are loadable into the casing body 2 in order along the grooves 12. The widths of the rectangular grooves 12 of the guide rails 11 are set to be the same as the thicknesses of the printed boards 3 to be loaded.

The thicknesses of printed boards vary because the numbers of layers of the printed boards also vary with the numbers of components to be mounted on the printed boards. Accordingly, the rectangular grooves 12 of the guide rails 11 provided in the shelf unit 1 are to be processed such that the widths thereof match the thicknesses of different kinds of the printed boards to be loaded.

The known printed-board-receiving structure employs adapters, which are to be attached to the printed board. Referring to FIG. 14A, adapters 14 each have a rectangular groove 16 and a projection 15 whose widths are substantially the same as the thickness at an end of a printed board 13.

Specifically, the adapters 14 can be attached to the printed board 13 by fitting the ends of the printed board 13 into the rectangular grooves 16 of the adapters 14. Each of the adapters 14 is secured to the printed board 13 with a screw 17, and the projection 15 of the adapter 14 is fitted into the rectangular groove 12 (FIG. 14B) of the guide rail 11. Thus, different kinds of printed boards are loadable into the shelf unit 1.

In the known art, in the case where printed boards having different thicknesses are to be loaded into a shelf unit, grooves of guide rails provided in the shelf unit are processed so as to have widths matching the thicknesses of the printed boards, or adapters that can be received by the guide rails having a common width are attached to the printed boards.

Another exemplary printed-board-receiving structure is disclosed in Japanese Unexamined Utility Model Registration Application Publication No. 07-14690. The structure includes substantially V-shaped guide rails extending in a direction in which printed boards are loaded, and stoppers and handles with which the printed boards are positioned.

Yet another exemplary printed-board-receiving structure is disclosed in Japanese Unexamined Patent Application Publication No. 11-68350. The structure includes a frame having a groove so as to hold a circuit board, whereby malfunction of the circuit board is prevented.

SUMMARY

According to an aspect of the embodiment, a printed board to be loaded into a printed-board-receiving structure having a backboard and a guide rail, the backboard having a connector plug-in connectable to a connector on the printed board, the guide rail guiding the printed board toward the backboard and having a groove including a sloping portion, the printed board includes a sloping portion forming a projection at an end of the printed board, the projection being fittable and slidable along the groove in the guide rail.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
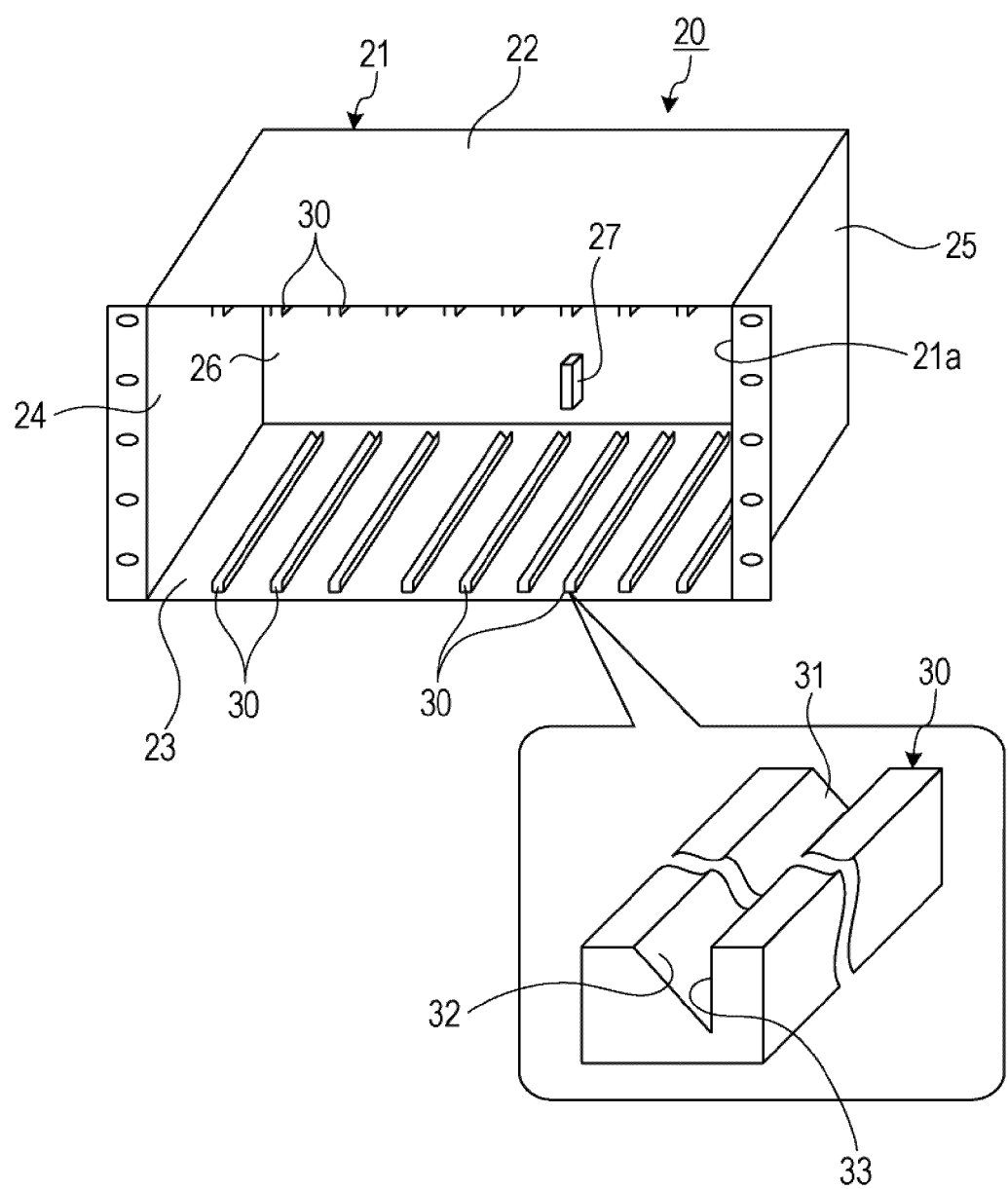
FIG. 1 is a perspective view of the appearance of a shelf unit according to a first embodiment.

The known printed-board-receiving structures have problems in that the grooves of the guide rails provided in the shelf units need to be processed so as to have appropriate widths matching the thicknesses of printed boards, and slot positions where printed boards having particular thicknesses may be loaded are limited, reducing the versatility of the shelf units.

Specifically, in such a printed-board-receiving structure, a particular slot of the shelf unit may not be shared between a plurality of printed boards having different functions if the printed boards have different thicknesses. Even if the guide rails are provided as separable members that are exchangeable, it is not easy to exchange such members after an apparatus including the structure is installed at a customer's site.

In the case where the printed-board-receiving structure employs adapters that may be attached to the ends of the printed board, spaces (about 10 mm) for attaching the adapters need to be provided at the top and bottom of the printed board. This unavoidably reduces areas for mounting components and wires on the printed board by an amount corresponding to the dimensions (the heights) of the adapters.

A need of increasing the thickness of a printed board means that there are a number of components and accompanying wires to be mounted. Therefore, it is a significant disadvantage that the use of the adapters reduces the component-mounting area and the wiring area. Moreover, in the case where the adapters are employed, miscellaneous components such as the screws for securing the adapters are also necessary. This increases the overall cost, including the component and material cost and the assembly and processing cost.

In light of the above, the present disclosure is to provide a printed board and a printed-board-receiving structure that enable loading of various kinds of printed boards having different thicknesses into a shelf unit without reducing the component mounting areas and the wiring areas on the printed boards.

According to the disclosure, a printed-board-receiving structure included in a shelf unit includes guide rails guiding a printed board toward a backboard. The guide rails each have a groove including a sloping portion. The printed board has at each end thereof a sloping portion forming a projection, the projection being fittable and slidable along the groove in a corresponding guide rail.

Thus, processing work including changing the configuration of the shelf unit may be reduced if not eliminated. Further, various kinds of printed boards having different thicknesses may be loaded into the shelf unit without changing the widths of the grooves in the guide rails. Moreover, there is realized a printed-board-receiving structure that does not limit the component mounting area or the wiring area of printed boards.

Printed boards and printed-board-receiving structures according to first to fifth embodiments of the present invention will now be described with reference to the drawings. It should be noted that the first to fifth embodiments described below do not limit the present invention.

Figure 2:
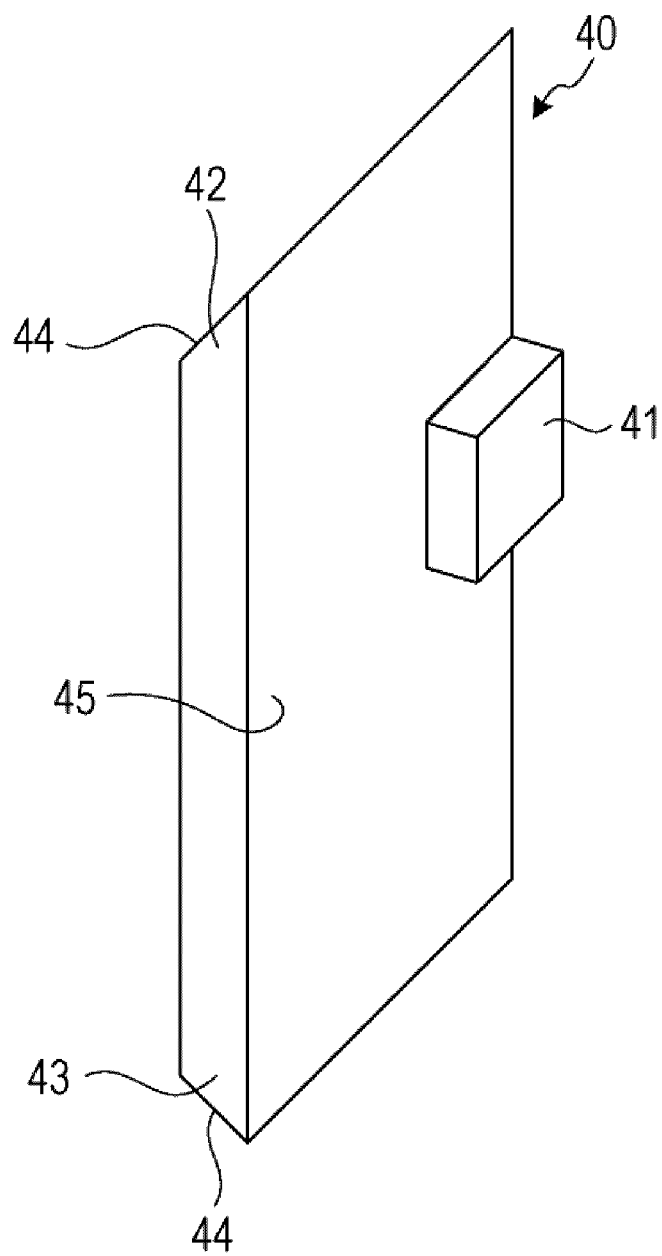
FIG. 2 is a perspective view of the appearance of a printed board.
Figure 3A:
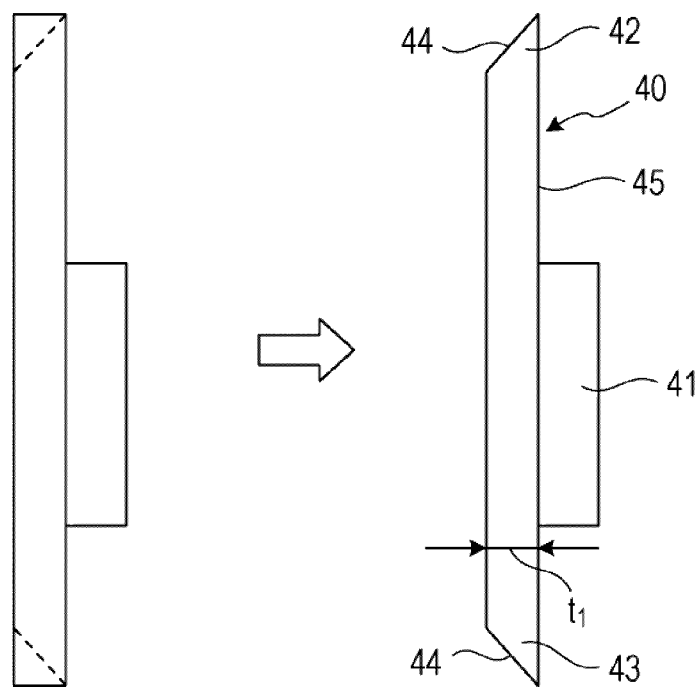
FIG. 3A is a longitudinal sectional view of the configuration of an exemplary printed board (having a thickness $t_1$)
Figure 3B:
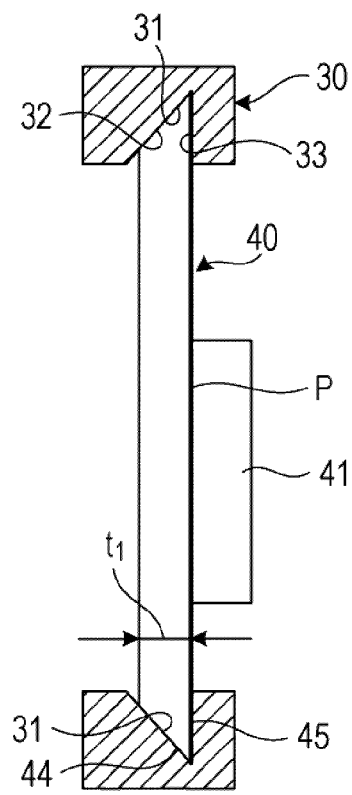
FIG. 3B is a longitudinal sectional view of the printed board loaded between guide rails.

A printed-board-receiving structure according to the first embodiment will now be described with reference to FIGS. 1 to 5B. FIGS. 1 and 2 are perspective views of the appearances of a shelf unit and a printed board, respectively, according to the first embodiment. FIGS. 3A and 3B are longitudinal sectional views of the configuration of an exemplary printed board (having a thickness $t_1$) and the printed board loaded between guide rails, respectively.

Figure 4:
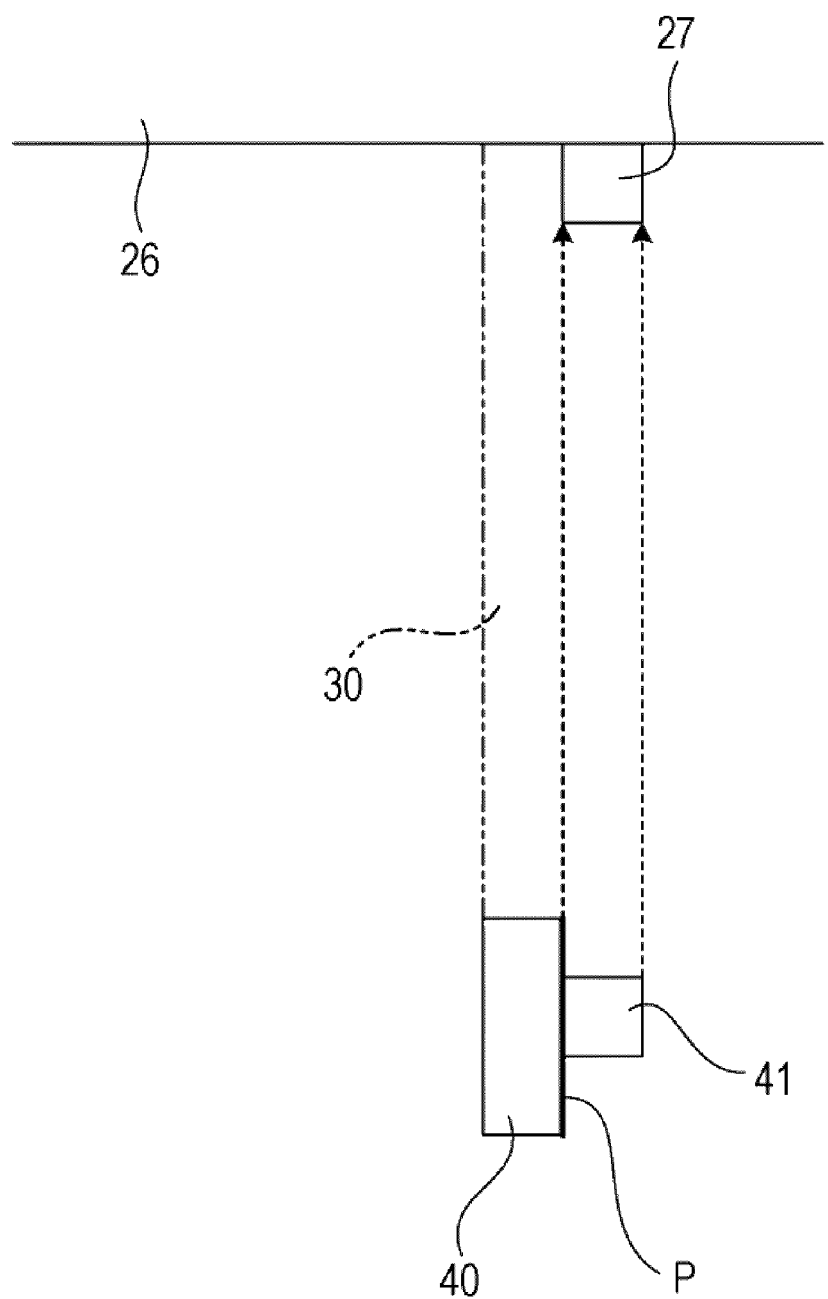
FIG. 4 illustrates a reference plane for the printed board and a connector on a backboard.
Figure 5A:
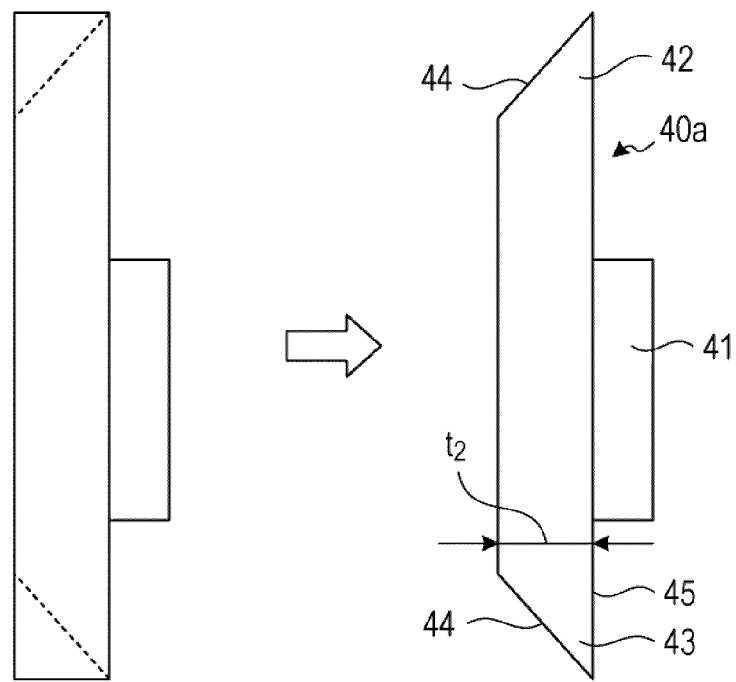
FIG. 5A is a longitudinal sectional view of the configuration of another exemplary printed board (having a thickness $t_2$)
Figure 5B:
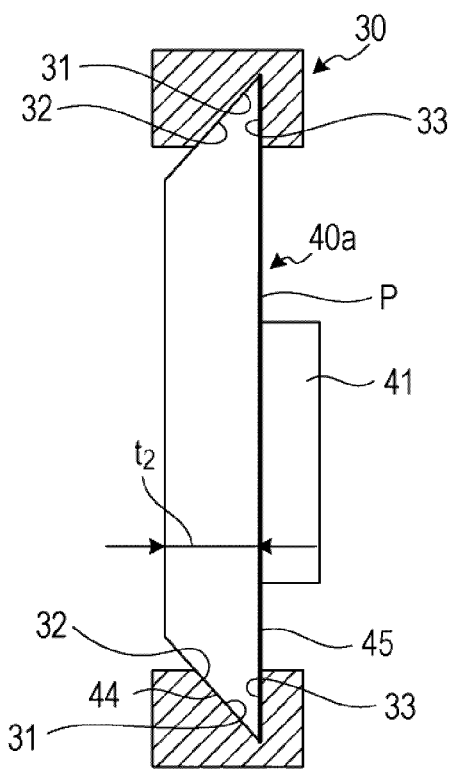
FIG. 5B is a longitudinal sectional view of the printed board loaded between the guide rails.

FIG. 4 illustrates a reference plane for the printed board and a connector on a backboard. FIGS. 5A and 5B are longitudinal sectional views of the configuration of another exemplary printed board (having a thickness $t_2$) and the printed board loaded between the guide rails, respectively.

The printed-board-receiving structure of the first embodiment is characterized by the shapes of guide rails 30 provided in a shelf unit 20, and a printed board 40 (FIG. 2). Basically, the guide rails 30 provided in the shelf unit 20 each have a slanted V-shaped groove 31, and the printed board 40 to be loaded between the guide rails 30 has each end thereof forming a slanted V-shaped projection so as to fit the shape of the groove 31 in the corresponding guide rail 30.

Referring to FIG. 1, the shelf unit 20 has a square shape on the whole, and includes a casing body 21 into which a plurality of the printed boards 40 are loadable so as to be held between the guide rails 30. The casing body 21 is made up of a top board 22 and a bottom board 23, a left-side board 24 and a right-side board 25, and a backboard 26 (BWB) provided at the back of the casing body 21. The casing body 21 has an opening 21a whose height is set to be substantially the same as that of the printed boards 40 (FIG. 2) to be loaded into the shelf unit 20.

Each printed board 40 (FIG. 2) has a connector 41 fixed at a particular position (approximately in the center in FIG. 2) thereof. The ends (a top end 42 and a bottom end 43) of the printed board 40 are both defined by a partially sloping portion (sloping portions 44) and a vertical portion 45.

Specifically, the printed board 40 (FIG. 2) of the first embodiment is processed into such a shape (with the thickness $t_1$) that the top end 42 and the bottom end 43 thereof are defined by the vertical portion 45 and the sloping portions 44 (by being cut off along the dashed lines illustrated in FIG. 3A), whereby the printed board 40 becomes loadable into the shelf unit 20. That is, the top end 42 and the bottom end 43 of the printed board 40 each form a slanted V-shaped projection so as to fit in the groove 31 of the guide rail 30.

The backboard 26 of the shelf unit 20 has at fixed positions thereof (at positions substantially on the extensions of the respective guide rails 30) a plurality of connectors 27 (only one is illustrated in FIG. 1) that are to engage with and thus become electrically connected to the connectors 41 on a plurality of the printed boards 40 (FIG. 2) to be loaded into the shelf unit 20.

Referring to FIG. 1, in the shelf unit 20, a plurality of the guide rails 30 (nine are illustrated in FIG. 1) are arranged on the lower surface of the top board 22 and the upper surface of the bottom board 23. The printed boards 40 are loaded in order between the upper and lower guide rails 30.

The guide rails 30 guide the printed boards 40 toward the backboard 26, with the top ends 42 and the bottom ends 43 thereof fitting in and sliding along the guide rails 30. The guide rails 30 each have the groove 31, which is defined by a sloping portion 32 and a vertical portion 33.

Thus, the guide rails 30 receive and guide the printed boards 40 loaded into the shelf unit 20 toward the backboard 26 such that the respective connectors 41 on the printed boards 40 assuredly engage with the respective connectors 27 on the backboard 26.

The vertical portion 33 of each guide rail 30 resides in a reference plane P (FIGS. 3B and 4), which coincides with a surface of the corresponding connector 27 on the backboard 26. Therefore, the connector 41 on each printed board 40 and the corresponding connector 27 on the backboard 26 may be aligned. Accordingly, assured electrical connection is realized between the connector 41 on the printed board 40 and the corresponding connector 27 on the backboard 26 of the shelf unit 20.

As described above, the guide rails 30 provided in the shelf unit 20 have the slanted V-shaped grooves 31, and the printed boards 40 to be loaded between the guide rails 30 have the ends thereof forming the slanted V-shaped projections so as to fit the shape of the grooves 31 in the guide rails 30. Therefore, even if the printed boards 40 have different thicknesses, the sloping portions 44 of the printed boards 40 fit the sloping portions 32 of the guide rails 30 at a particular angle. Thus, the guide rails 30 may accommodate different kinds of the printed boards 40, regardless of the thicknesses of the printed boards 40.

The case illustrated in FIG. 3B will now be considered where the printed board 40 (having the thickness $t_1$) is to be loaded between the guide rails 30 into the shelf unit 20. The sloping portion 44 and the vertical portion 45 at the top end 42 of the printed board 40 fit the sloping portion 32 and the vertical portion 33, respectively, of the upper guide rail 30. The sloping portion 44 and the vertical portion 45 at the bottom end 43 of the printed board 40 fit the sloping portion 32 and the vertical portion 33, respectively, of the lower guide rail 30. Thus, the printed board 40 may be easily loaded between the guide rails 30 provided in the shelf unit 20.

In this case, as described above, the reference plane P (FIGS. 3B and 4) coincides with the surface of the connector 27 on the backboard 26. That is, the connector 41 on the printed board 40 and the connector 27 on the backboard 26 are aligned. Therefore, the connector 41 on the printed board 40 may assuredly engage with and be electrically connected to the connector 27 on the backboard 26 without deviation.

Referring to FIG. 5A, a thick printed board 40a (having the thickness $t_2$) is also processed into such a shape that a top end 42 and a bottom end 43 thereof are each defined by a sloping portion 44 and a vertical portion 45 (by being cut off along the dashed lines).

Referring to FIG. 5B, also in a case where the printed board 40a (having the thickness $t_2$) thicker than the printed board 40 illustrated in FIG. 3B is to be set (loaded) between the guide rails 30, the same situation illustrated in FIG. 3B applies. That is, the sloping portions 44 and the vertical portions 45 at the top and bottom ends 42 and 43 of the printed board 40a are made to fit the sloping portions 32 and the vertical portions 33 of the upper and lower guide rails 30.

In this case, as in the case illustrated in FIG. 3B, the vertical portion 33 of each guide rail 30 resides in the reference plane P (FIGS. 4 and 5B), which coincides with the surface of the corresponding connector 27 on the backboard 26. Therefore, the connector 41 on the printed board 40a and the connector 27 on the backboard 26 may be aligned. Accordingly, assured electrical connection is realized between the connectors 27 and 41 without deviation.

To summarize, in the printed-board-receiving structure of the first embodiment, the guide rails 30 in the shelf unit 20 have the slanted V-shaped grooves 31, and the ends of the printed board 40 to be loaded between the guide rails 30 form the slanted V-shaped projections so as to fit the grooves 31 of the guide rails 30. Therefore, even in the case where a plurality of the printed boards 40 have different thicknesses, the printed boards 40 may be loaded into the shelf unit 20, without performing any processing for changing the shape (width) of the grooves 31 of the guide rails 30 in accordance with the thicknesses of the printed boards.

Moreover, the printed-board-receiving structure of the first embodiment does not require an addition of any accessories, such as adapters, to the printed boards 40. Therefore, the component mounting area and the wiring area may be provided as originally intended, leading to cost reduction.

In addition, the printed-board-receiving structure of the first embodiment does not require any processing for changing the configuration of the shelf unit 20. Therefore, a product having versatility may be realized.

Figure 6A:
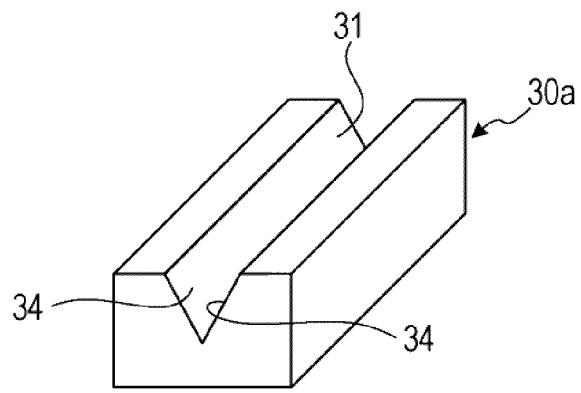
FIG. 6A is an enlarged perspective view illustrating details of a guide rail provided in a shelf unit according to a second embodiment.
Figure 6B:
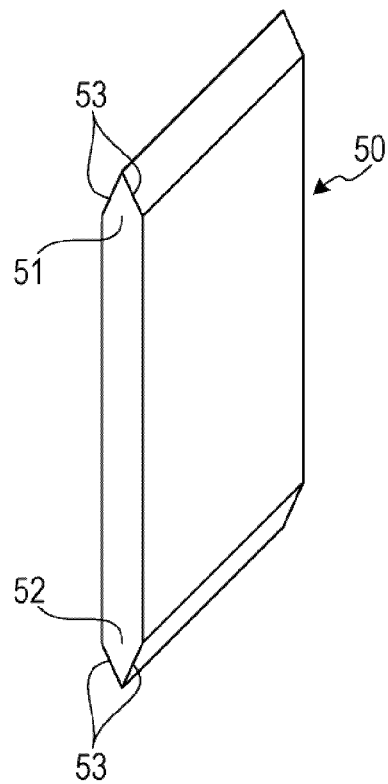
FIG. 6B is a perspective view illustrating the appearance of a printed board.

A printed-board-receiving structure according to a second embodiment will now be described with reference to FIGS. 6A to 7B. FIG. 6A is an enlarged perspective view illustrating details of a guide rail provided in a shelf unit according to the second embodiment. FIG. 6B is a perspective view of the appearance of a printed board.

Figure 7A:
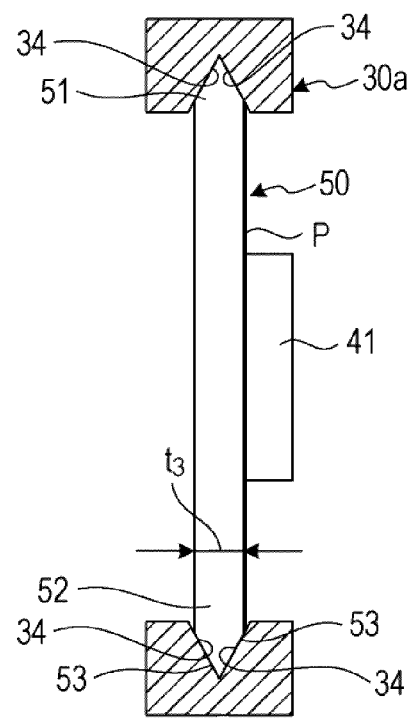
FIG. 7A is a longitudinal sectional view of an exemplary printed board (having a thickness $t_3$) loaded between the guide rails.
Figure 7B:
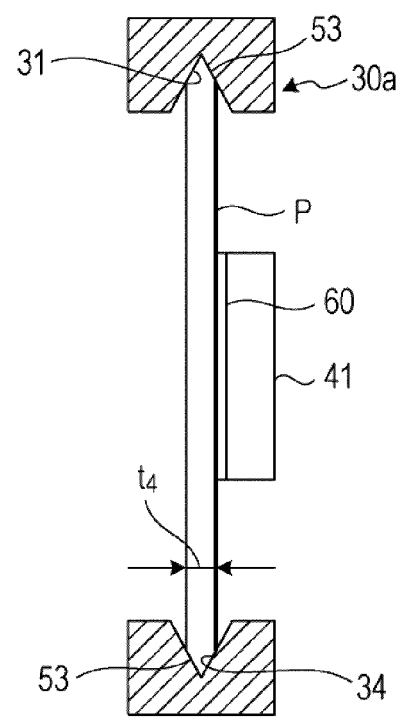
FIG. 7B is a longitudinal sectional view of another exemplary printed board (having a thickness $t_4$) loaded between the guide rails.

FIG. 7A is a longitudinal sectional view of an exemplary printed board (having a thickness $t_3$) loaded between the guide rails. FIG. 7B is a longitudinal sectional view of another exemplary printed board (having a thickness $t_4$) loaded between the guide rails.

The printed-board-receiving structure of the second embodiment is characterized by the shapes of guide rails 30a provided in the shelf unit 20 and a printed board 50 (FIG. 6B). Basically, the guide rails 30a provided in the shelf unit 20 each have a V-shaped groove 31, and the printed board 50 to be loaded between the guide rails 30a has each end thereof forming a V-shaped projection so as to fit the shape of the corresponding groove 31.

Specifically, referring to FIG. 6A, the guide rails 30a provided in the shelf unit 20 (FIG. 1) each have the V-shaped groove 31 defined by a pair of sloping portions 34, and the printed board 50 to be loaded between the guide rails 30a have each end thereof forming a V-shaped projection so as to fit the shape of the groove 31 in the guide rail 30a.

Referring to FIG. 6B, the printed board 50 has a top end 51 and a bottom end 52 respectively forming V-shaped projections defined by pairs of sloping portions 53. The projections are fitted into the grooves 31 provided in the guide rails 30a such that the sloping portions 53 fit the sloping portions 34.

Referring to FIG. 7A, in a case where the printed board 50 (having the thickness $t_3$) is to be loaded between the guide rails 30a provided in the shelf unit 20 (FIG. 1), the sloping portions 53 at the top and bottom ends 51 and 52 of the printed board 50 fit the sloping portions 34 of the upper and lower guide rails 30a, respectively.

In this case, as in the first embodiment, the reference plane P coincides with the surface of the corresponding connector 27 on the backboard 26. That is, the connector 41 on the printed board 50 and the connector 27 on the backboard 26 are aligned. Therefore, the connector 41 on the printed board 50 may assuredly engage with and be electrically connected to the connector 27 on the backboard 26 without deviation.

Referring to FIG. 7B, in a case where the printed board 50 of the second embodiment is thin (with the thickness $t_4$) compared with a reference case where the printed board 50 has the maximum thickness, the reference plane P deviates from the surface (near the connector 41) of the connector 27 on the backboard 26 by an amount corresponding to the difference in thickness. To solve this, a spacer 60 is interposed between the connector 41 and the printed board 50.

Thus, the connector 41 on the printed board 50 and the connector 27 on the backboard 26 may be aligned on the reference plane P, as described above. Accordingly, the connectors 27 and 41 may be made to engage with each other, whereby assured electrical connection therebetween is realized.

To summarize, in the printed-board-receiving structure of the second embodiment, the guide rails 30a in the shelf unit 20 have the V-shaped grooves 31, and the ends of the printed board 50 to be loaded between the guide rails 30a form the V-shaped projections so as to fit the grooves 31 of the guide rails 30a. Therefore, as in the first embodiment, even in the case where a plurality of the printed boards 50 have different thicknesses, the printed boards 50 may be loaded into the shelf unit 20, without performing any processing for changing the shape (width) of the grooves 31 of the guide rails 30a in accordance with the thicknesses of the printed boards 50.

Figure 8A:
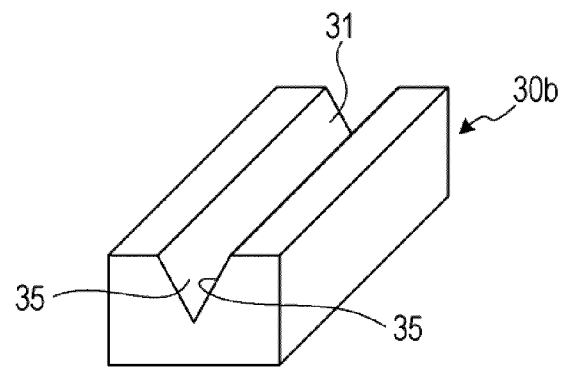
FIG. 8A is an enlarged perspective view illustrating details of a guide rail provided in a shelf unit according to a third embodiment.
Figure 8B:
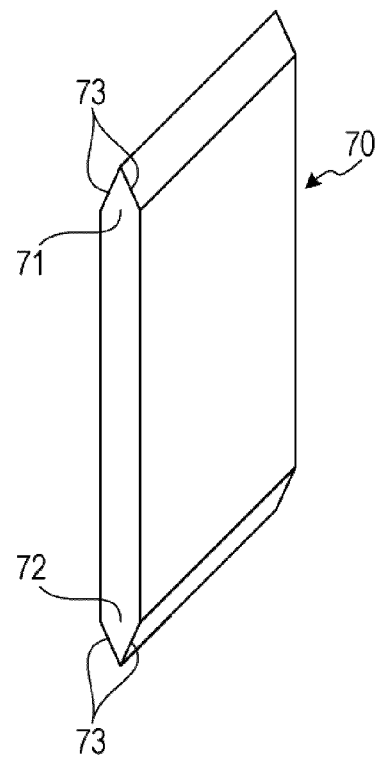
FIG. 8B is a perspective view illustrating the appearance of a printed board.

A printed-board-receiving structure according to the third embodiment will now be described with reference to FIGS. 8A to 9B. FIG. 8A is an enlarged perspective view illustrating details of a guide rail provided in a shelf unit according to the third embodiment. FIG. 8B is a perspective view illustrating the appearance of a printed board.

Figure 9A:
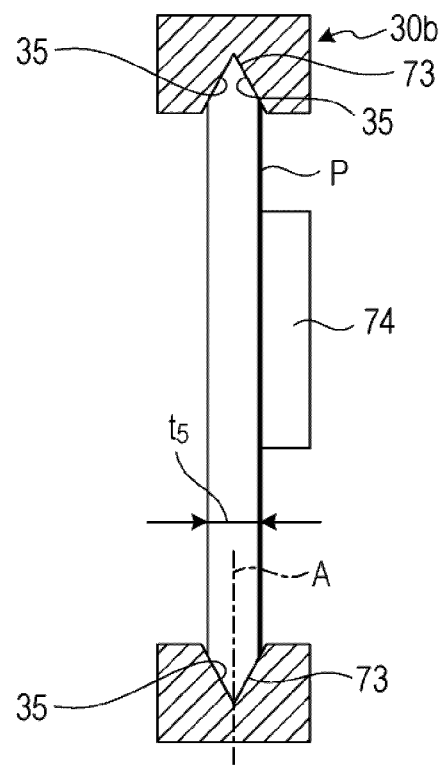
FIG. 9A is a longitudinal sectional view of an exemplary printed board (having a thickness $t_5$) loaded between the guide rails.
Figure 9B:
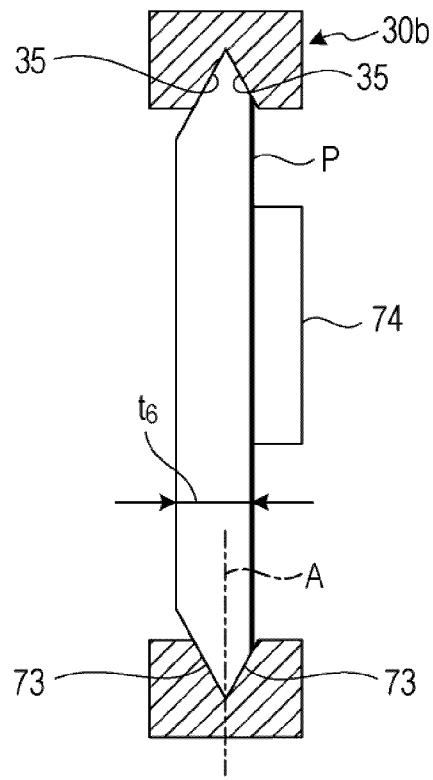
FIG. 9B is a longitudinal sectional view of another exemplary printed board (having a thickness $t_6$) loaded between the guide rails.

FIG. 9A is a longitudinal sectional view of an exemplary printed board (having a thickness $t_5$) loaded between the guide rails. FIG. 9B is a longitudinal sectional view of another exemplary printed board (having a thickness $t_6$) loaded between the guide rails.

The printed-board-receiving structure of the third embodiment is characterized by the shapes of guide rails 30b provided in the shelf unit 20 (FIG. 1) and a printed board 70. Basically, the guide rails 30b each have a V-shaped groove 31, as in the second embodiment, and the printed board 70 to be loaded between the guide rails 30b has a thickness that may be increased toward a particular direction (away from the reference plane P) with respect to an apex A (FIGS. 9A and 9B).

Referring to FIGS. 8A to 9B, in the printed-board-receiving structure of the third embodiment, the V-shaped grooves 31 of the guide rails 30b provided in the shelf unit 20 (FIG. 1) are each defined by a pair of sloping portions 35, and the printed board 70 to be loaded between the guide rails 30b have each end thereof forming a V-shaped projection so as to fit the shape of the groove 31 in the guide rail 30b.

Referring to FIG. 8B, the V-shaped projections at a top end 71 and a bottom end 72 of the printed board 70 are each defined by a pair of sloping portions 73. The projections are fitted into the respective grooves 31 in the guide rails 30b.

In the third embodiment, to change the thickness of the printed board 70 (in particular, to increase the thickness as in FIG. 9B), the printed board 70 is processed such that the thickness thereof is increased only on a side (a soldering side in FIGS. 9A and 9B) opposite a side near the connector 27 on the backboard 26 with respect to the apex A of the V shape. Thus, the structure may accommodate the printed boards 70 having different thicknesses.

In the above second embodiment, if the thickness of the printed board 50 to be loaded changes, the spacer 60 (FIG. 7B) is used so as to adjust the position of the connector 41. Whereas, in the third embodiment, even if the thickness of the printed board 70 to be loaded changes, the position where the connector 27 on the backboard 26 engages with a connector 74 on the printed board 70 does not change. Accordingly, there is no need to add any accessories, such as the spacer 60 (FIG. 7B), for adjusting the position of the connector 74.

In the case illustrated in FIG. 9A where the printed board 70 has a relatively moderate thickness ($t_5$) and is to be loaded between the guide rails 30b, the printed board 70 is prepared such that a section in the thickness direction thereof has a substantially symmetric shape with respect to the apex A, which divides the thickness $t_5$ in half. When the printed board 70 having such a shape is loaded between the guide rails 30b, the connector 74 on the printed board 70 and the connector 27 on the backboard 26 may be aligned on the reference plane P. Accordingly, the connectors 27 and 74 may be made to engage with each other without deviation.

In the case illustrated in FIG. 9B where the printed board 70 has a relatively large thickness ($t_6$) and is to be loaded between the guide rails 30b, the printed board 70 is prepared such that the thickness thereof is increased on the side (the soldering side) opposite the side near the connector 27 on the backboard 26 with respect to the apex A. When the printed board 70 having such a shape is loaded between the guide rails 30b, the connector 74 on the printed board 70 and the connector 27 on the backboard 26 may be aligned on the reference plane P. Accordingly, the connectors 27 and 74 may be made to engage with each other, whereby assured electrical connection therebetween is realized.

To summarize, the printed-board-receiving structure of the third embodiment is configured such that the thickness of the printed board 70 having the V-shaped ends is increased only on the side (the soldering side) opposite the side near the connector 27 on the backboard 26 with respect to the apex A. Therefore, the connectors 27 and 74 may be aligned on the reference plane P. Thus, the connectors 27 and 74 may be made to engage with each other without deviation. Accordingly, there is no need to add any accessories, such as a spacer, for adjusting the position of the connector 74.

Configuration of Adapters to be Attached to Printed Board

Figure 10:
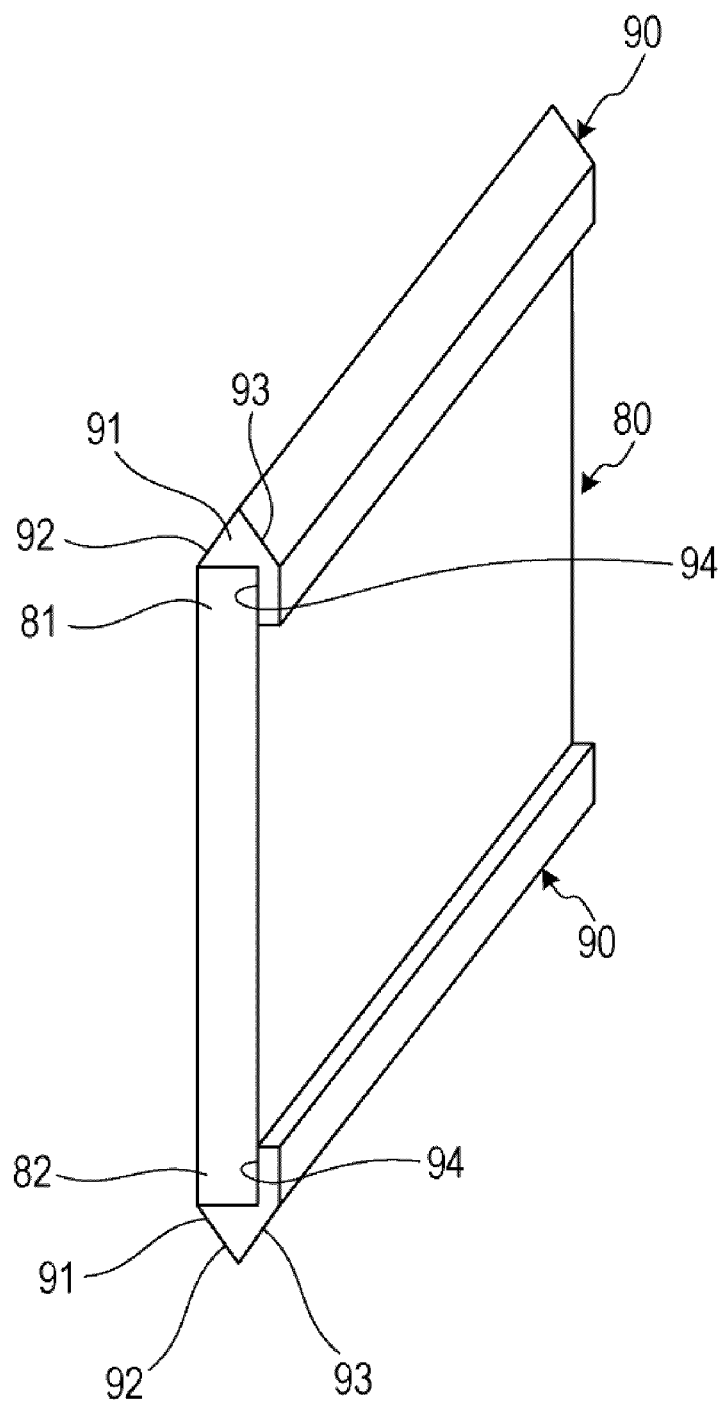
FIG. 10 is a perspective view illustrating the appearance of a printed board to which adapters are attached, according to a fourth embodiment.
Figure 11A:
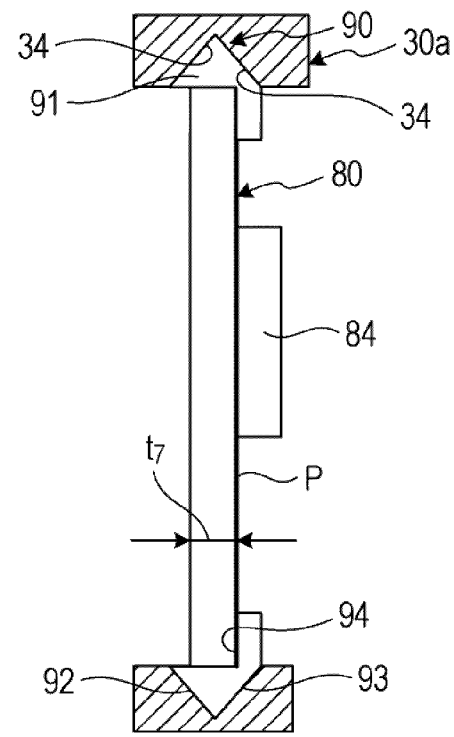
FIG. 11A is a longitudinal sectional view of an exemplary printed board (having a thickness $t_7$) having the adapters and loaded between guide rails.
Figure 11B:
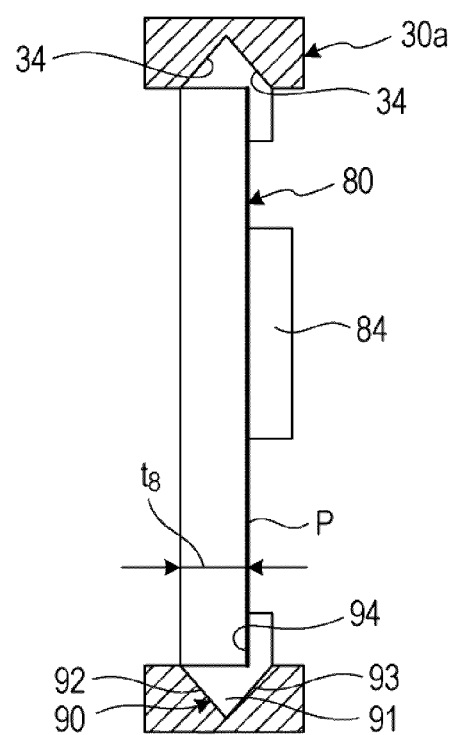
FIG. 11B is a longitudinal sectional view of another exemplary printed board (having a thickness $t_8$) having the adapters and loaded between the guide rails.

A printed-board-receiving structure according to the fourth embodiment will now be described with reference to FIGS. 10 to 11B. FIG. 10 is a perspective view of the appearance of a printed board to which adapters are attached, according to the fourth embodiment. FIG. 11A is a longitudinal sectional view of an exemplary printed board (having a thickness $t_7$) having the adapters and loaded between guide rails. FIG. 11B is a longitudinal sectional view of another exemplary printed board (having a thickness $t_8$) having the adapters and loaded between the guide rails.

Referring to FIGS. 10 to 11B, the printed-board-receiving structure of the fourth embodiment is characterized in that adapters 90 are attached to a printed board 80. Basically, the adapters 90, each having a projection 91 with a shape fitting the groove 31 of the corresponding guide rail 30a, are attached to a top end 81 and a bottom end 82 of the printed board 80 to be loaded between the guide rails 30a provided in the shelf unit 20 (FIG. 1).

Referring to FIGS. 10 to 11B, the projections 91 of the adapters 90 have a V-shape and are each defined by a pair of sloping portions 92 and 93 and a vertical portion 94. Each adapter 90 is attached to the printed board 80 such that the vertical portion 94 is in contact with a portion at the corresponding end of the printed board 80. The projection 91 may be fitted in the groove 31 of the guide rail 30a. The adapters 90 are attached to the printed board 80 with adhesive or securing screws.

Referring to FIG. 11A, when the printed board 80 (having the thickness $t_7$) is loaded between the guide rails 30a in the shelf unit 20, the sloping portions 92 and 93 of one adapter 90 attached to the top end 81 of the printed board 80 fit the sloping portions 34, respectively, defining the groove 31 of the upper guide rail 30a.

Further, the sloping portions 92 and 93 of the other adapter 90 attached to the bottom end 82 of the printed board 80 fit the sloping portions 34, respectively, defining the groove 31 of the lower guide rail 30a. In this state, as described in the second embodiment, the connector 84 on the printed board 80 and the connector 27 on the backboard 26 may be aligned on the reference plane P. Accordingly, the connectors 27 and 84 may be made to engage with each other, whereby assured electrical connection therebetween is realized.

Also in a case illustrated in FIG. 11B where the printed board 80 has a relatively large thickness ($t_8$) and is to be loaded between the guide rails 30a in the shelf unit 20, the sloping portions 92 and 93 of the adapters 90 attached to the top and bottom ends 81 and 82 of the printed board 80 fit the sloping portions 34 defining the groove 31 of the upper and lower guide rails 30a. Therefore, also in this case, the connector 84 on the printed board 80 and the connector 27 on the backboard 26 may be aligned on the reference plane P. Accordingly, the connectors 27 and 84 may be made to engage with each other, whereby assured electrical connection therebetween is realized.

To summarize, the printed-board-receiving structure of the fourth embodiment includes the adapters 90 attached to the top and bottom ends 81 and 82 of the printed board 80 to be loaded between the guide rails 30a in the shelf unit 20, the adapters 90 each having the projection 91 that is fittable and slidable along the sloping portions 34 defining the groove 31 of the corresponding guide rail 30a. Therefore, the ends (the top and bottom ends 81 and 82) of the printed board 80 do not need to be processed so as to have sloping portions forming projections.

Figure 12:
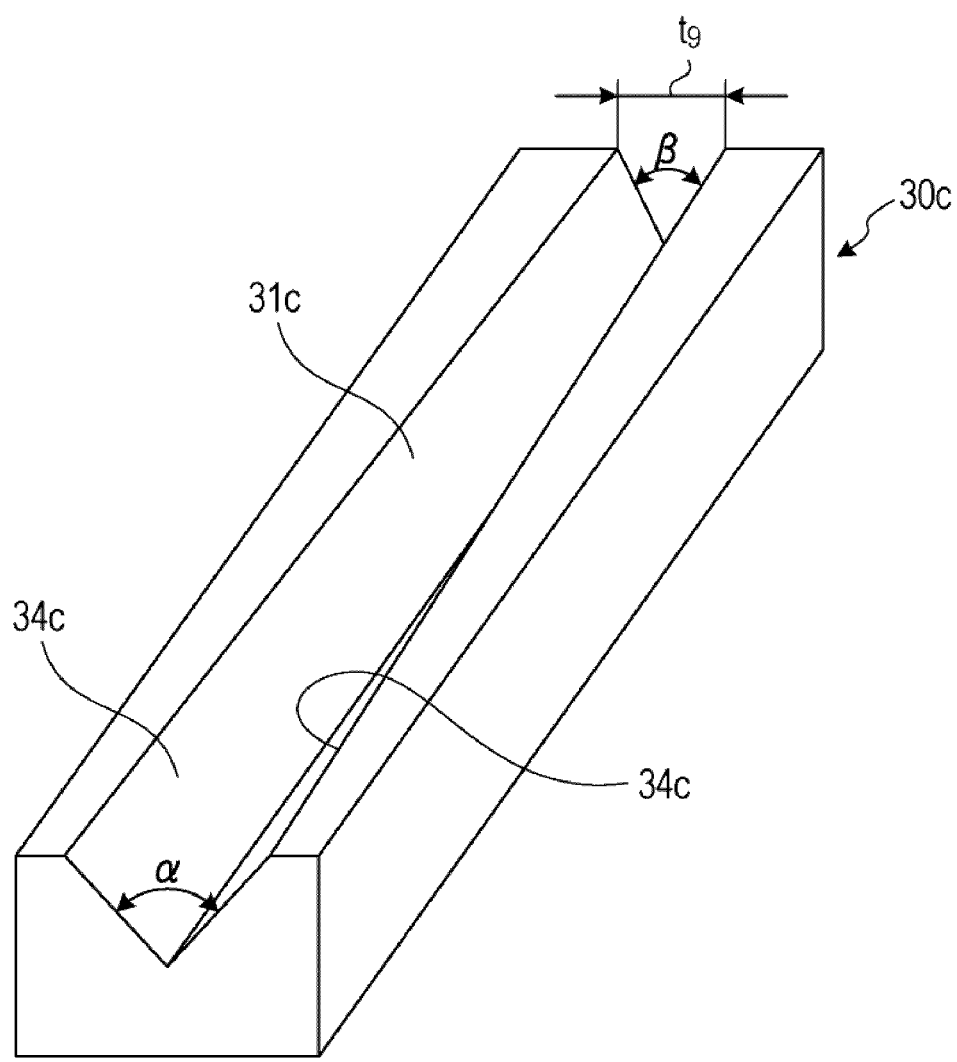
FIG. 12 is a perspective view illustrating details of a guide rail according to a fifth embodiment.
Figure 13:
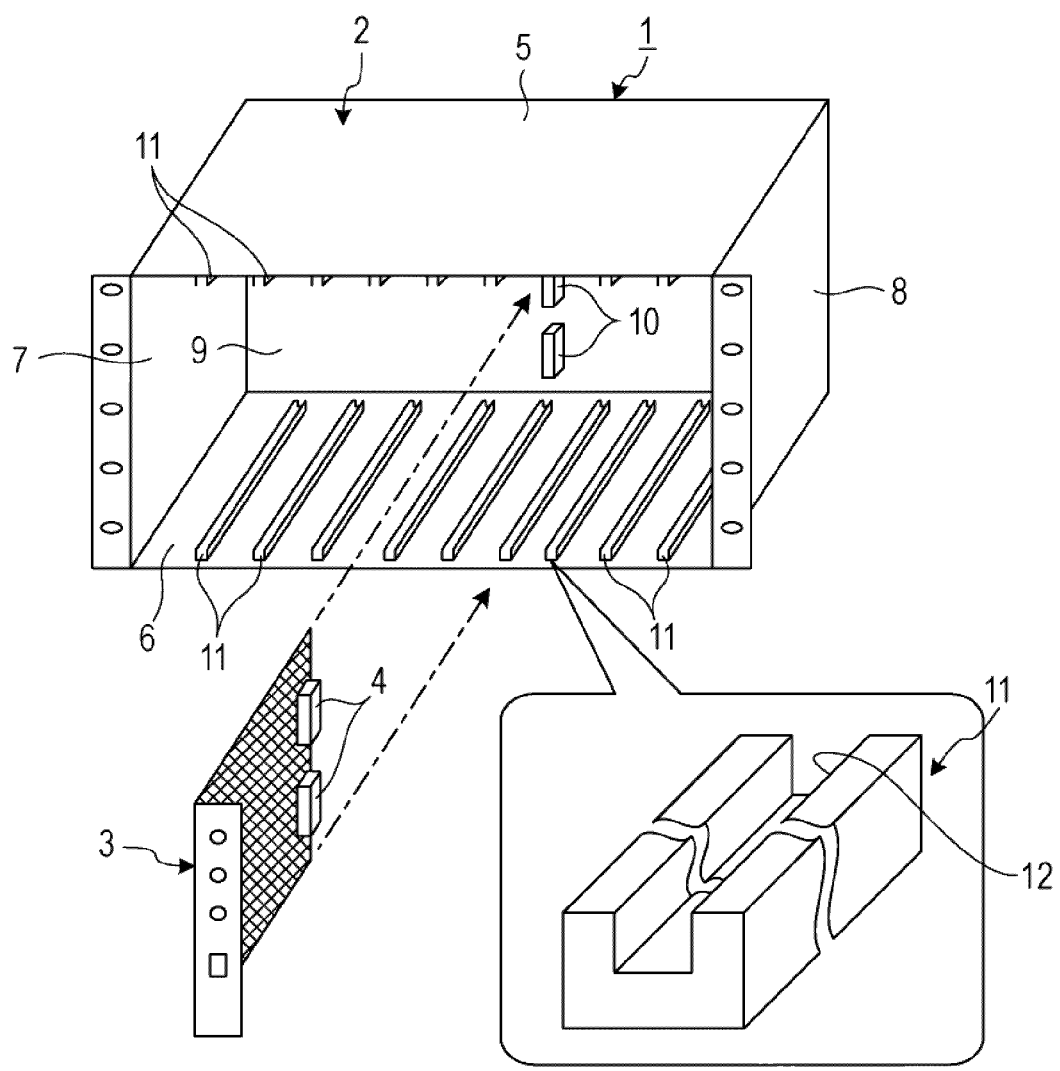
FIG. 13 is a perspective view illustrating the appearance of a known shelf unit.
Figure 14A:
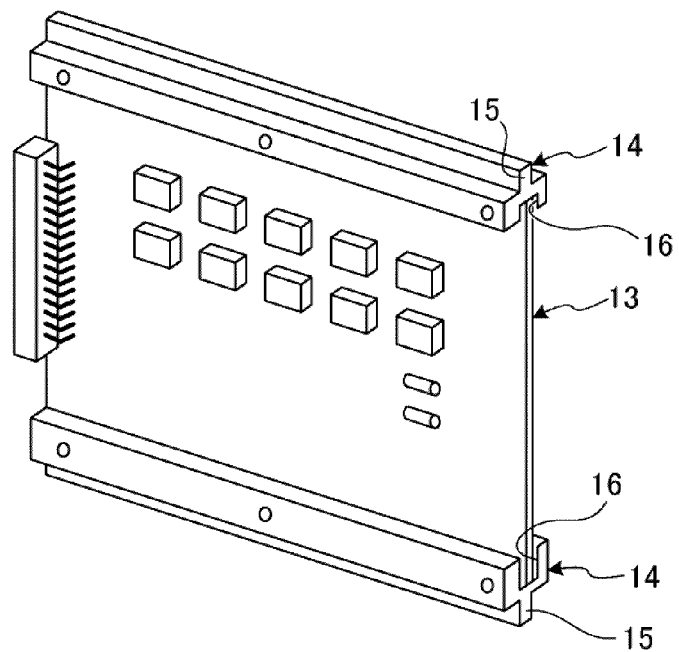
FIG. 14A is a perspective view of a printed board to be used with the known shelf unit.
Figure 14B:
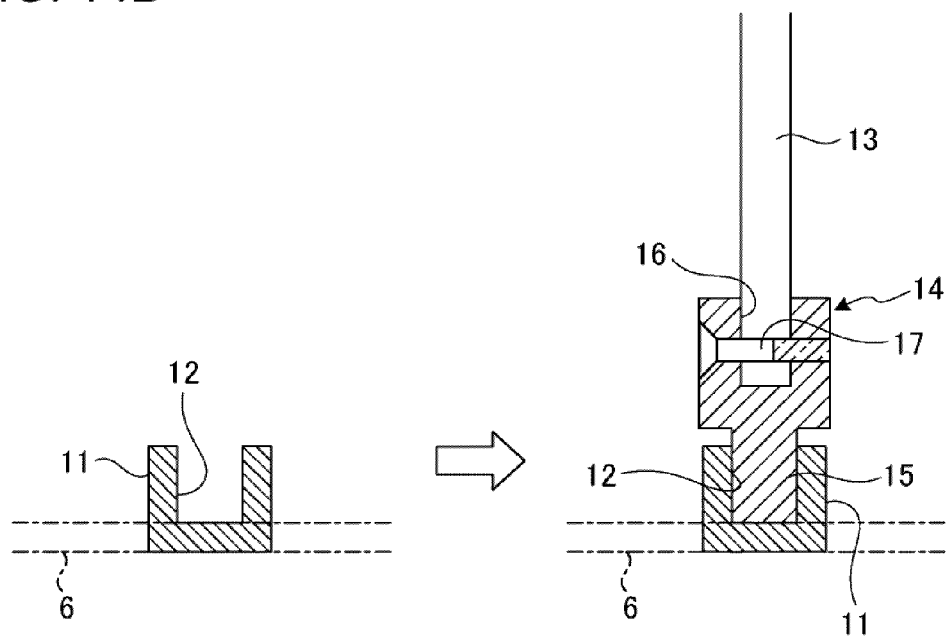
FIG. 14B is a longitudinal sectional view of relevant parts of the printed board illustrated in FIG. 14A.

A printed-board-receiving structure according to the fifth embodiment will now be described with reference to FIG. 12. FIG. 12 is a perspective view illustrating details of a guide rail according to the fifth embodiment. The fifth embodiment concerns guide rails 30c each having a groove 31c with a V shape (FIG. 6A).

The printed-board-receiving structure of the fifth embodiment is characterized by the shape of the guide rails 30c provided in the shelf unit 20. Basically, the grooves 31c of the guide rails 30c provided in the shelf unit 20 are tapered, instead of extending linearly (with a constant width).

That is, referring to FIG. 12, each of the guide rails 30c of the fifth embodiment provided in the shelf unit 20 (FIG. 1) has the groove 31c whose opening angle (angle between sloping portions) gradually decreases toward the backboard 26 of the shelf unit 20, from an angle α to an angle β.

The opening angle at the mouth, i.e., the position from which the printed board 80 is inserted, of each of the guide rails 30c provided in the shelf unit 20 (FIG. 1) is set to be a large angle (α), and the angle becomes smaller toward the backboard 26 (FIG. 1) and ultimately becomes a relatively small angle (β).

The thickness of the printed board 50 (FIG. 6B), which is used in the fifth embodiment, is relatively smaller than a width $t_9$ of the groove 31c at the rear of the guide rail 30c where the relatively small angle (β) is formed.

Thus, the sloping portions 53 of the printed board 50 (FIG. 6B) may be made to fit sloping portions 34c of the guide rail 30c, and the printed board 50 may be loaded (inserted) easily. In addition, the connector 41 on the printed board 50 and the connector 27 on the backboard 26 may be aligned and electrically connected to each other assuredly.

To summarize, the printed-board-receiving structure of the fifth embodiment includes the guide rails 30c each having such a shape that the opening angle (the angle between sloping portions) of the V-shaped groove 31c gradually decreases toward the backboard 26, from the larger angle α at the mouth of the guide rail 30c to the smaller angle β. This makes it easy to load (insert) the printed board 50. In addition, the connector 41 on the printed board 50 and the connector 27 on the backboard 26 may be aligned and electrically connected to each other assuredly.

Some known printed-board-receiving structures require guide pins or the like for aligning the connectors on the printed boards and the connectors on the backboards. Whereas, in the fifth embodiment, such alignment guide pins required in the known structures are unnecessary because the connectors 27 and 41 may be aligned easily.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A printed board to be loaded into a printed-board-receiving structure having a backboard and a guide rail, the backboard having a connector plug-in connectable to a connector on the printed board, the guide rail guiding the printed board toward the backboard and having a groove including a sloping portion, the printed board comprising:
   a sloping portion forming a projection at an end of the printed board, the projection being fittable and slidable along the groove in the guide rail,
   wherein the printed board is provided at the end thereof with an adapter having a sloping portion forming a projection, the projection of the adapter being fittable and slidable along the groove in the guide rail.

2. The printed board according to claim 1, wherein the projection at the end of the printed board is provided in a slanted V-shape or a V-shape.

3. The printed board according to claim 1, wherein the projection of the adapter is provided in a slanted V-shape or a V-shape.

4. A printed-board-receiving structure included in a shelf unit configured to receive therein a printed board, the shelf unit including a backboard having a connector plug-in connectable to a connector on the printed board, the structure comprising:

guide rails provided on a top board and a bottom board of the shelf unit and guiding a top end and a bottom end, respectively, of the printed board toward the backboard, wherein the guide rails each have a groove including a vertical portion and a sloping portion sloping at an angle with respect to the vertical portion, and wherein the printed board has at each of the top and bottom ends thereof a sloping portion forming a projection, the projection being fittable and slidable along the vertical portion and the sloping portion of the groove in a corresponding guide rail.

5. The printed-board-receiving structure according to claim 4, wherein the projections at the top and bottom ends of the printed board are provided in a slanted V-shape or a V-shape.

6. The printed-board-receiving structure according to claim 4, wherein the printed board is provided at each of the top and bottom ends thereof with an adapter having a sloping portion forming a projection, the projection of the adapter being fittable and slidable along the vertical portion and the sloping portion of the groove in the corresponding guide rail.

7. The printed-board-receiving structure according to claim 6, wherein the projections of the adapters are provided in a slanted V-shape or a V-shape.

8. The printed-board-receiving structure according to claim 4, wherein a height of the connector on the printed board is adjustable with a spacer having such dimensions that the connector on the printed board and the connector on the backboard are aligned so as to be engageable with each other.

9. The printed-board-receiving structure according to claim 4, wherein the vertical portions of the grooves in the guide rails each reside at such a position so as to be in contact with a part of a vertical portion formed by the top and bottom ends of the printed board, and the vertical portions of the grooves in the guide rails define a reference plane on which the connector on the printed board and the connector on the backboard are aligned so as to be engageable with each other.

10. The printed-board-receiving structure according to claim 4, wherein an opening angle of the groove in each of the guide rails gradually decreases toward the backboard.

* * * * *